United States Patent
Kim et al.

(10) Patent No.: US 7,649,795 B2
(45) Date of Patent: Jan. 19, 2010

(54) MEMORY WITH FLEXIBLE SERIAL INTERFACES AND METHOD FOR ACCESSING MEMORY THEREOF

(75) Inventors: Bup Joong Kim, Daejeon (KR); Yong Wook Ra, Chunlabook-do (KR); Woo Young Choi, Daejeon (KR); Byung Jun Ahn, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 316 days.

(21) Appl. No.: 11/524,235

(22) Filed: Sep. 19, 2006

(65) Prior Publication Data

US 2007/0133311 A1 Jun. 14, 2007

(30) Foreign Application Priority Data

Dec. 8, 2005 (KR) .................. 10-2005-0119919
Jul. 4, 2006 (KR) .................. 10-2006-0062660

(51) Int. Cl.
*G11C 7/00* (2006.01)
(52) U.S. Cl. .................. 365/219; 365/220; 365/221; 365/189.02
(58) Field of Classification Search ......... 365/219–221, 365/189.02, 189.05, 230.02, 230.06; 710/107; 711/207

See application file for complete search history.

(56) References Cited

U.S. PATENT DOCUMENTS

| 5,293,597 | A |  | 3/1994 | Jensen et al. |
| 5,852,738 | A |  | 12/1998 | Bealkowski et al. |
| 6,029,217 | A |  | 2/2000 | Arimilli et al. |
| 6,137,734 | A | * | 10/2000 | Schoner et al. ............. 365/194 |
| 7,167,410 | B2 | * | 1/2007 | Boecker et al. ........ 365/230.06 |
| 7,313,639 | B2 | * | 12/2007 | Perego et al. ................. 710/71 |

FOREIGN PATENT DOCUMENTS

| JP | 2000-181898 | 6/2000 |
| KR | 1996-0024937 | 7/1996 |
| KR | 153017 | 7/1998 |
| WO | WO 03/021455 A1 | 3/2003 |
| WO | WO 2004/102403 A2 | 11/2004 |
| WO | WO 2005/089418 A2 | 9/2005 |

* cited by examiner

*Primary Examiner*—David Lam
(74) *Attorney, Agent, or Firm*—Blakely, Sokoloff, Taylor & Zafman LLP

(57) ABSTRACT

A memory system with a flexible serial interface and a memory accessing method thereof are provided. The memory system includes at least one of memories and a memory controller. The memory controller flexibly sets up serial link connection with each of the memories through serial ports regardless of a physical location and an order of the serial ports. The memory controller also transmits and receives memory data in a serial mode through the serial link connection.

17 Claims, 10 Drawing Sheets

MEMORY WITH FLEXIBLE SERIAL INTERFACES AND METHOD FOR ACCESSING MEMORY THEREOF

RELATED APPLICATION

The present application is based on, and claims priority from, Korean Application Number 2005-0119919, filed Dec. 8, 2005 and Korean Application Number 2006-0062660, filed Jul. 4, 2006, the disclosure of which is hereby incorporated by reference herein in its entirety.

BACKGROUND OF THE INVENTION

1. Field of the Invention

The present invention relates to a memory system and a memory accessing method thereof, and more particularly, to a memory system with a flexible serial interface and a memory accessing method thereof.

2. Description of the Related Art

Generally, a synchronous dynamic random access memory (SDRAM), a rambus DRAM (RDRAM), a static RAM (SRAM) and a fast cycle RAM (FCRAM) are widely used a memory system. Most of them have a bus type parallel interface and uses an independent clock signal. A memory controller creates and outputs an address signal and a control signal to read and write data from/to the memory in response to a memory access instruction from a central processing unit (CPU). Also, the memory controller reads data from the memory through a data line and transfers the read data to the CPU or writes data from the CPU to the memory. As a semiconductor technology has been highly developed, the integrity has abruptly increased. Therefore, a CPU and a memory controller were often manufactured as a single chip.

A high performance CPU requires a broad bandwidth memory bus and a large memory space for storing great quantity of data. However, a conventional parallel memory interface requires a number of memory pins to dispose at the memory controller in order to accommodate large quantity of memory. Also, the conventional parallel memory interface must create data, address and control signals to be synchronized with a high clock in order to satisfy the broad bandwidth memory interface. In order to stably access a memory in high-clocking, the number of memories connected to a bus must be reduced, while minimizing the signal interference and the influence of reflection which are generated at a bus type memory interface.

In order to embody the memory interface on a print circuit board (PCB), there were many limitations existed in arranging related elements and related signal wiring, the number of layers increases, and an expensive and high-quality substrate is required. Also, methods for confronting malfunctioning of a memory bus are limited. For example, if more than two data buses are malfunctioned, it cannot be recovered.

Due to such a reason, there is a demand for an enhanced memory accessing method that can support a high performance CPU, be connected to a large capacity of memory in high speed, reduce a cost of designing a print circuit board, minimize an error, and have a confronting capability against malfunctioning of a memory interface.

SUMMARY OF THE INVENTION

The present invention provides a memory with flexible serial interface and method for accessing for memory thereof that substantially obviates one or more problems due to limitations and disadvantages of the related art.

An object of the present invention is to provide a memory system that includes a memory controller with a plurality of serial link ports and flexibly forms the connection of serial link ports in allocating of serial links in response to a request from a memory, which allows easy wiring and arranging elements on a printed circuit board, and a memory accessing method thereof.

Another object of the present invention is to provide a memory system that includes a memory controller with a plurality of serial link ports, arranges serial link ports by a memory through a memory initializing operation in allocating serial links in response to a request from a memory, manages memory speed information, size information, and other setting up information by memories, changes address locations of memories regardless of the connection structure of serial links, and checks the malfunctioning of a memory and a memory connection link, and a memory accessing method thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a memory system with flexible serial interfaces includes: at least one of memories; and a memory controller for flexibly setting up serial link connection with each of the memories through the serial ports regardless of a physical location and an order of serial ports, and transmitting and receiving memory data in a serial mode through the serial link connection.

The memory controller may change the number of available serial links to the memory if it is necessary.

The memory controller may change address information corresponding to a memory ID regardless of physical serial link connection to the memory.

The memory controller may include: an address decoder for decoding input address information of a memory device; a memory data transmitter for detecting a memory ID corresponding to the input address information, transmitting the detected memory ID, processing corresponding data, initializing and managing the memory; a memory data converter for internally exchanging information with the memory data transmitter, searching a serial port for the memory ID, converting serial memory data to parallel memory data, and managing the serial ports; and a plurality of serial ports for transmitting memory data to the memory through the serial links in a high speed serial mode.

The memory data transmitter may include: a memory map table for managing memory addresses inputted from the address decoder and corresponding memory IDs; a data processing unit for managing information for processing memory data according to the memory data address information, control information, size information and error checking information as a parallel format memory data packet; and a memory initializing and managing unit for scanning the memory, managing the memory map table, and managing whether the memory is malfunctioned or not.

The memory data converter may include: an internal header processing unit for exchanging internal information with the memory data transmitter; a memory ID table for managing and searching serial link ports corresponding to the memory IDs; a data signal converter for converting parallel memory data to serial memory data; and a link managing unit for checking states of serial ports, reporting malfunctioned links, and processing the malfunctioned links.

The memory ID table may include a physical link number and a virtual link number corresponding to the memory ID.

While initializing the memory, the memory controller may search physical serial ports connected to the memory, arrange the searched serial ports with the memory as the reference, assign virtual serial port numbers to the physical serial ports connected to the same memory sequentially from a lower number, and transmit the result thereof to serial ports of the memory through corresponding serial ports so as to enable the serial ports of the memory to have virtual serial port numbers identical to those of the memory controller.

The memory controller may transmit and receive serial link state information to/from the memory, store malfunctioned link information, and establish a memory interface only with available links without using malfunctioned link in the memory initialization The memory controller may initialize the memory by at least one of electric power, a reset signal or a memory initialization instruction.

The memory controller may obtain a transmission delay difference among serial links connected to the same memory while initializing the memory and corrects the transmission delay difference for transmitting and receiving serial data to/from the memory.

The memory controller may sequentially transmit a memory ID request message to a memory through each serial pot for finding serial ports connected to a same memory, and the memory may transmit an own memory ID to the memory controller as a response message.

The memory controller may store the memory ID in the memory or in an external read-only memory, or using an externally inputted pull up/down signal.

The memory may include: a memory core including a memory logic; a data processing unit for processing memory data; a memory storing unit for storing the memory data; a link managing and converting unit for managing serial links connected to the memory controller and converting serial memory data to parallel memory data; and a plurality of serial ports connected to the memory controller through the serial links for transmitting and receiving the memory data to/from the memory controller based on a serial mode.

According to an aspect of the present invention, there is provided a memory controller with flexible serial interfaces for initializing a memory and delivering memory data, the memory controller may include: an address decoder for decoding input address information of a memory device; a memory data transmitter for detecting a memory ID corresponding to the input address information, transmitting the detected memory ID, processing corresponding data, initializing and managing the memory; a memory data converter for internally exchanging information with the memory data transmitter, searching a serial port for the memory ID, converting serial memory data to parallel memory data, and managing the serial ports; and a plurality of serial ports for transmitting memory data to the memory through the serial links in a high speed serial mode, wherein the memory data is transmitted and received to/from the memory through the serial ports regardless of physical locations of the serial ports and a serial port order.

The memory data converter may include: an internal header processing unit for exchanging internal information with the memory data transmitter; a memory ID table for managing and searching serial link ports corresponding to the memory IDs; a data signal converter for converting parallel memory data to serial memory data; and a link managing unit for checking states of serial ports, reporting malfunctioned links, and processing the malfunctioned links.

According to another aspect of the present invention, there is provided a memory with flexible serial interfaces which are accessed by a memory controller, the memory includes: a memory core including a memory logic; a data processing unit for processing memory data; a memory storing unit for storing the memory data; a link managing and converting unit for managing serial links connected to the memory controller and converting serial memory data to parallel memory data; and a plurality of serial ports connected to the memory controller through the serial links for transmitting and receiving the memory data to/from the memory controller based on a serial mode.

According to still another aspect of the present invention, there is provided a method for accessing a memory from a memory controller with flexible serial interface, the method including the steps of: a) initializing links to access memories by searching the memories to access at a memory controller; b) when a memory reading instruction is inputted, receiving a parallel memory address and a control instruction, searching a corresponding memory ID based on the received parallel memory address and control instruction, finding a connection link from the memory ID, converting the parallel memory address and control instruction to serial data, and transmitting the serial data with an instruction request number to a corresponding memory through the connection link; c) at the memory, receiving a reading instruction and an address, and transmitting corresponding data through a connection link with an instruction request number at a memory core; d) checking the instruction request number from data inputted through the serial port, converting serial data to parallel data, and transferring the reading instruction corresponding to the instruction request number; e) when a reading instruction transmitting side writes the memory, finding a corresponding serial link from parallel data and an address, and transmitting the found serial link with an instruction request number to the memory; and f) writing the data at a memory core by receiving a writing instruction at the memory.

The b) step may include the steps of: transmitting a memory ID, a size information and speed information request message to a memory and receiving a response from the memory; inputting link information by the memory IDs to a memory ID table; inputting address locations by the memory IDs to a memory map table; synchronizing links connected to a same memory; and exchanging virtual link numbers of links connected to the same memory.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
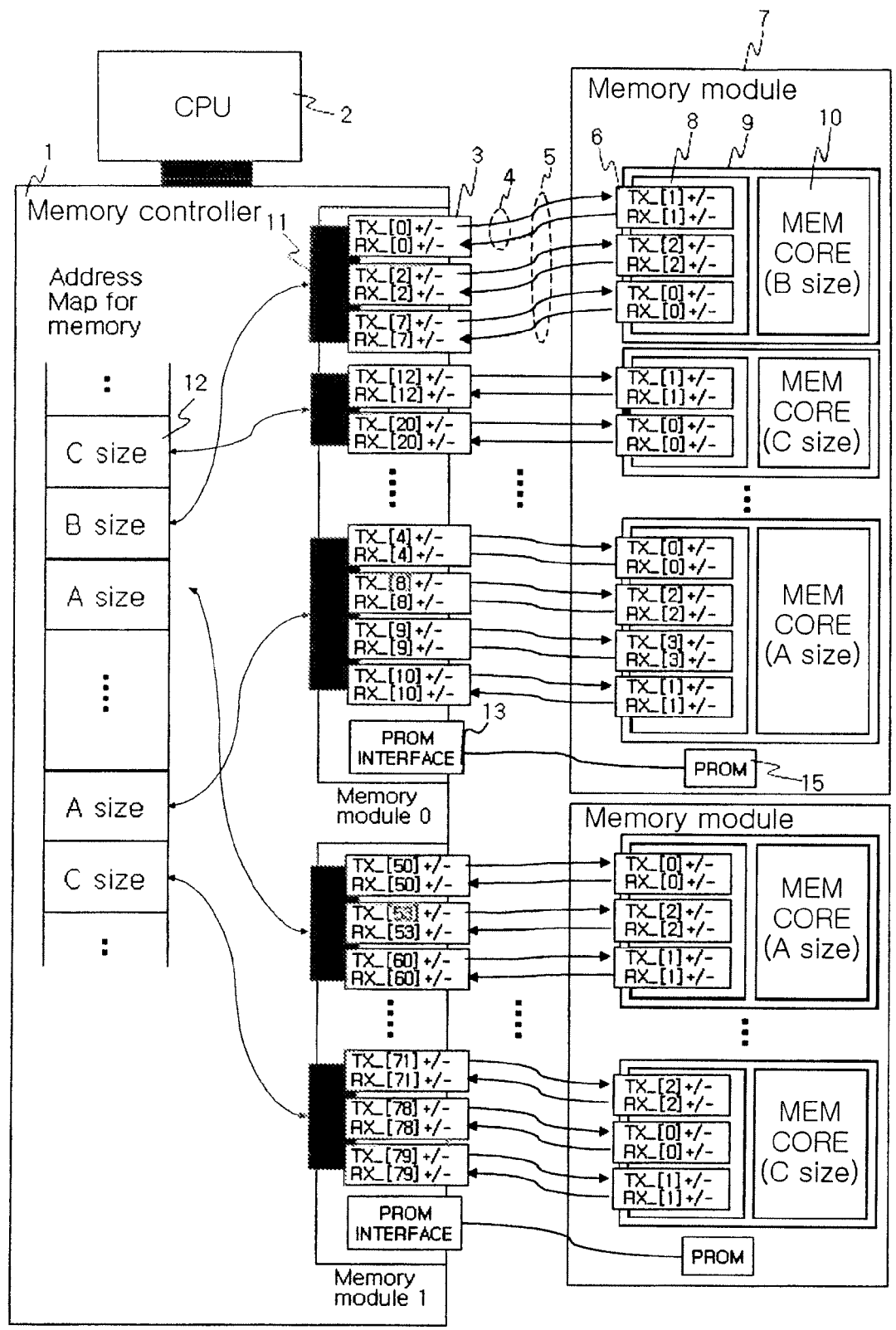
FIG. 1 is a block diagram illustrating a memory controller connected to a memory based on a high-speed flexible serial interface scheme according to an embodiment of the present invention.

FIG. 1 is a block diagram illustrating a memory controller connected to a memory based on a high-speed flexible serial interface scheme according to an embodiment of the present invention.

Referring to FIG. 1, a memory controller 1 includes a plurality of serial ports 3. Each of the serial ports is correspondently connected to the serial port 6 of an opponent serial port 6 through a serial link 4. A memory channel 5 formed of at least one of serial links 4 becomes a connecting path between the memory controller 1 and the memories 9.

Data can be exchanged between the memory controller 1 and each memory 9 if at least one of the serial links 4 is provided. The number of the corresponding serial links 4 can increase as many as the number of ports that support the memory 9.

Each memory 9 reads and writes memory value from/to a memory core 10 through a serial-to-parallel data converting and address/control information processing block 8 having a serial port 6. The memory controller 1 includes an address map 12 for decoding the memory access address of a central processing unit (CPU) 2 and finds a serial link group 11 of a memory to access through the address map 12. The locations of the memories 9 on the address map 12 are decided at a memory initializing step regardless of the number of physical serial links between each memory 9 and the memory controller 1. When one of the memories 9 is malfunctioned, the memory controller 1 deletes the malfunctioned memory from the address map 12 and fills the deleted memory location of the address map 12 with other memories. As described above, the memory controller 1 can change the number of available serial links to the memories 9 if it is necessary.

A memory module 7 may include a plurality of memories 9 and a programmable read only memory (PROM) 15 for storing the information about the memory module 7. Therefore, the memory controller 1 may fetch the information about the memory module 7 from the PROM 15 of the memory module 7 through a signal path 14 between a PROM interface port 13 and the PROM 15.

Figure 2:
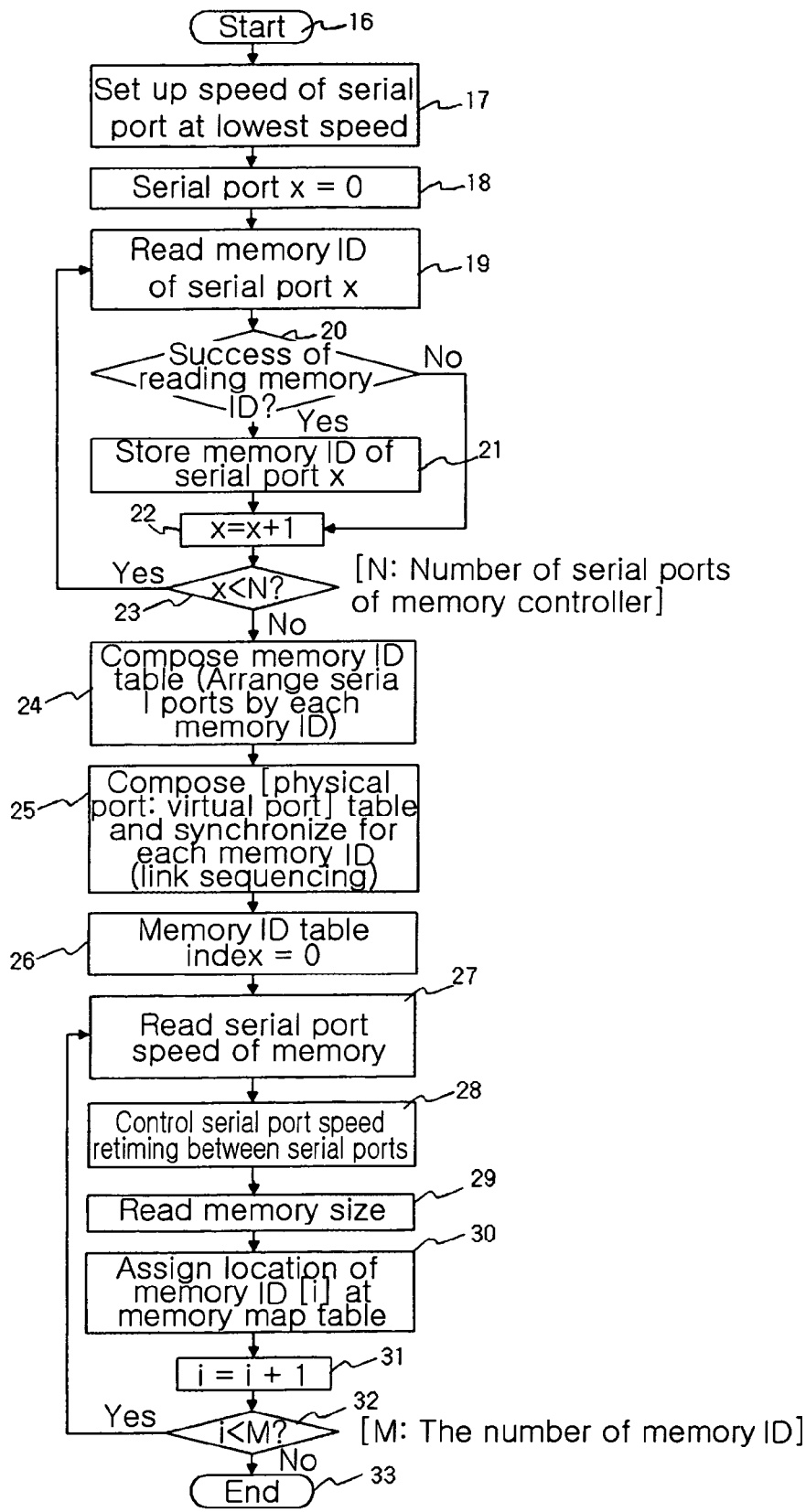
FIG. 2 is a flowchart showing a memory initializing step in the memory controller shown in FIG. 1.

FIG. 2 is a flowchart showing a memory initializing step in the memory controller shown in FIG. 1.

As shown in FIG. 2, when setting a memory is requested at step S16, the memory controller 1 sets up the speeds of all serial ports as the lowest speed at step S17. Then, the memory controller 1 reads memory IDs from the beginning of the serial ports at steps S18 and S19. The memory controller 1 outputs a memory ID request message through the serial port 3, and checks whether a response message is transmitted from the memory 9 or not at step S20. If the memory controller 1 receives a memory ID from the memory 9, the memory controller 1 stores the received memory ID for corresponding serial port 6 at step S21.

After reading the memory IDs of one serial port, the memory controller 1 reads memory IDs of next serial port using the same method at step S22. If there is no more serial ports left at step S23, a memory ID table is composed at step S24. That is, at step S24, the memory controller 1 composes a memory ID table after reading the memory IDs of all serial ports, and assigns the information and the number of the serial ports for each memory ID at step S25. Herein, the memory controller 1 flexibly sets up the connection of the serial links with the memory through the serial ports regardless of the physical location and the order of the serial ports. Then, the memory controller 1 transmits memory data through the serial link connection based on serial mode. As described above, the memory controller 1 and the memories 9 are connected each other in a unit of serial link 4 and they are connected not to be limited by the predetermined serial ports or the predetermined port group of the memory controller 1. Also, the connection of the serial links 4 is established not to be restricted by the order or the number of the serial ports. After establishing the serial link connection, the memory controller 1 transmits a virtual serial port number to the memories 9 through each of the serial ports, and the memories 9 set up the virtual serial port number of each serial port by receiving the virtual serial port number from the memory controller 1. As a result, the virtual serial port numbers of the memory controller 1 and the memories 9 become identical although physical serial port numbers are different between the memory controller 1 and the memories 9. Accordingly, the memory controller 1 is allowed to access the memories 9 through the virtual serial ports.

That is, the memory controller 1 reads the fastest serial port speed of a corresponding memory at step S27 from the first index of the memory ID table at step S26. Then, the memory controller 1 sets up the optimized serial link speed between the memory controller 1 and the memories 9 and compensates the transmission delay between the serial ports connected to the same memories at step S28. Also, the memory controller 1 reads the size information of memories at step S29, and the address location of the corresponding memory is assigned at the memory map table at step S30. The memory controller 1 repeatedly performs the above operations until the last index of the memory ID table at steps S31 and S32. After then, the memory controller 1 sustains the memory setting up completion state for reading and writing the real memory data at step S33.

Figure 3:
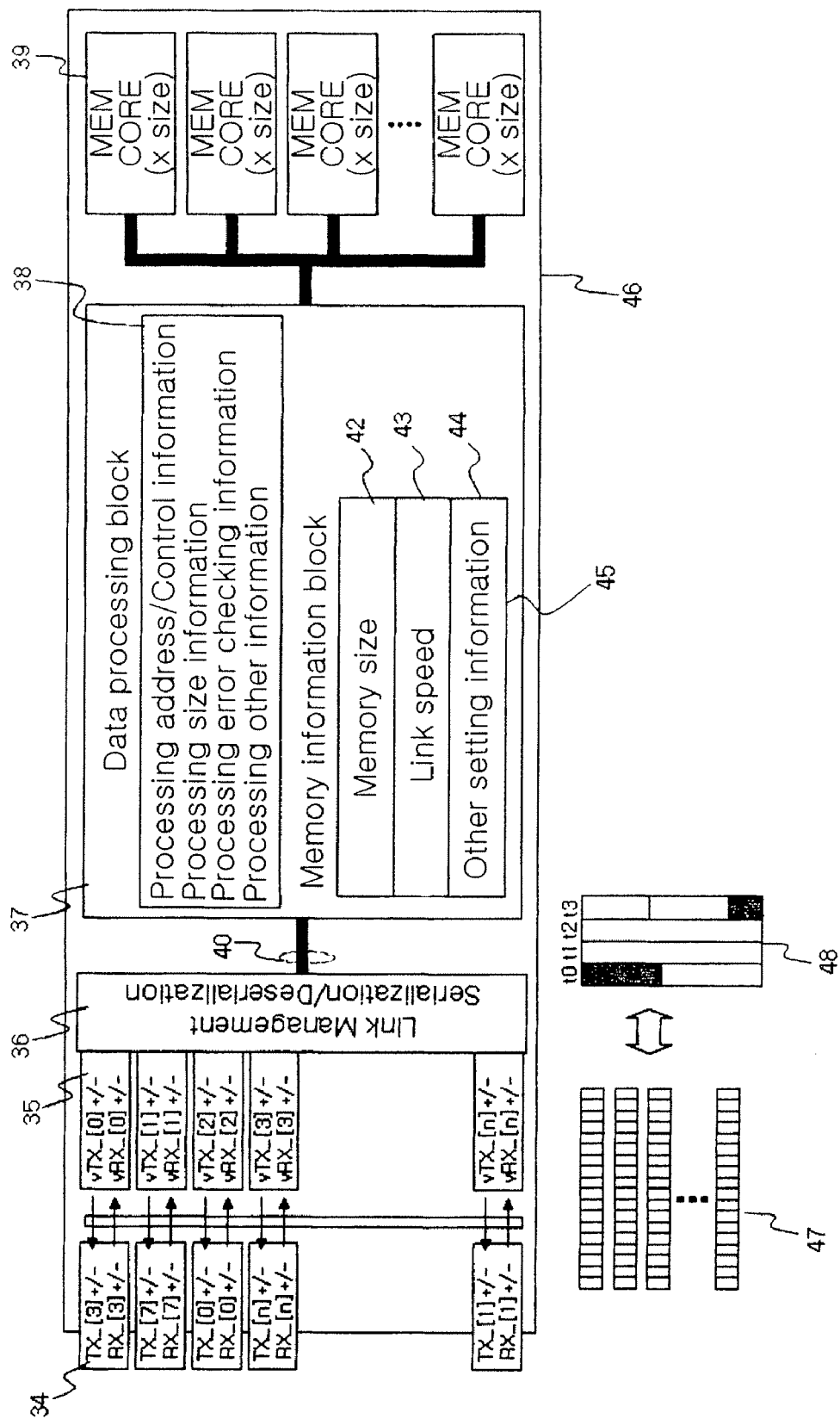
FIG. 3 is a block diagram illustrating an internal structure of a memory according to an embodiment of the present invention.

FIG. 3 is a block diagram illustrating an internal structure of a memory according to an embodiment of the present invention.

As shown in FIG. 3, each of serial ports 34 in a memory 46 functions as a path for exchanging serial data to the memory controller 1 and is mapped to the same virtual serial port 35 of the memory controller 1.

A serialization/deserialization block 36 performs a serial-to-parallel memory data conversion. Also, the serialization/deserialization block 36 manages states of each serial port and controls the serial ports. That is, the serialization/deserialization block 36 transforms the serial data to the parallel data and transmits the parallel data to a memory data transmission block 37 through a parallel data bus 40 of the memory 46, where the memory data transmission block 37 includes a data processing block 38 and a memory information block 45.

A data processing block 38 reads and writs data from/to a memory core 39 using the address of memory data and the controlling information. Also, the data processing block 38 performs a consecutive write operation and a consecutive read operation using information about the size of the memory. Furthermore, the data processing block 38 finds data errors using error checking information and performs related operations by gathering all other information together related to the data.

A memory information block 45 includes memory size information 42, serial port speed information 43 and memory setting up information 44 which are required in the memory setting up step. The memory data is loaded at each serial port as a serial data format 47 in the serial port step. Also, the memory data is loaded at a bus as the parallel data format of a data packet structure 48.

Figure 4:
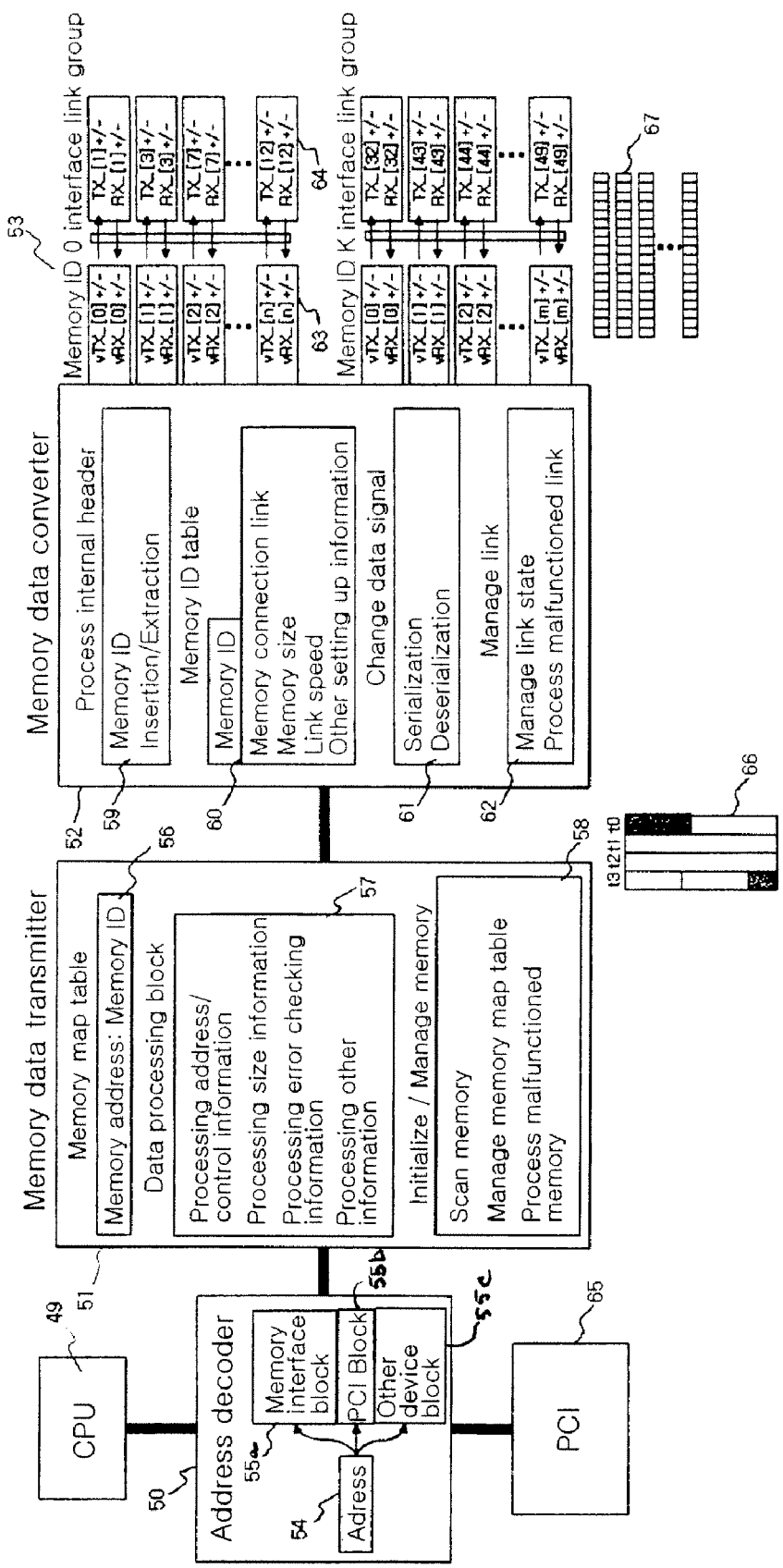
FIG. 4 is a block diagram illustrating an internal structure of a memory controller according to an embodiment of the present invention.

FIG. 4 is a block diagram illustrating an internal structure of a memory controller according to an embodiment of the present invention.

As shown in FIG. 4, the memory controller 1 includes an address decoder 50, a memory data transmitter 51, a memory data converter 52 and a serial port block 53 in order to access a memory. The address decoder 50 receives addresses 54 from the CPU 49 and activates a memory interface block 55a, a PCI device block 55b and an I/O device block 55c. According to the present embodiment, the memory access is allowed when the address decoder 50 decodes the memory interface block 55a. PCI device block 55b interfaces with PCI 65.

The memory data transmitter 51 finds a corresponding memory address and a related memory ID from the memory map table 56 when the address decoder 50 activates the memory interface block 55a and transfers the address 54 from the CPU 49. Then, the memory data transmitter 51 transmits the results thereof to the memory data converter 52 as an internal header format.

Also, the memory data transmitter 51 includes a data processing block 57 for gathering memory data address information, control information, size information, error checking information and other information required for processing other memory data together and creating a parallel format memory data packet, and a memory initializing/managing block 58 for scanning a memory, managing a memory map and processing a malfunctioned memory.

The memory data converter 52 includes an internal header processing block 59 for exchanging internal information with the memory data transmitter 51, a memory ID table 60 for finding serial link ports related to a memory ID, a data signal converting block 61 for converting a parallel memory data packet 66 to a serial memory data 67, and a link managing block 62 for checking the states of the serial ports, reporting malfunctioned links and processing the malfunctioned links.

The serial port block 53 includes a virtual serial port 63 and a physical serial port 64. The serial port block 53 outputs serial memory data 67 from the memory data converter 52 to a corresponding memory or transfers serial memory data 67 from a memory to the memory data converter 52. A memory ID table 60 stores mapping information between a virtual link port 63 and a physical link port 64.

Figure 5:
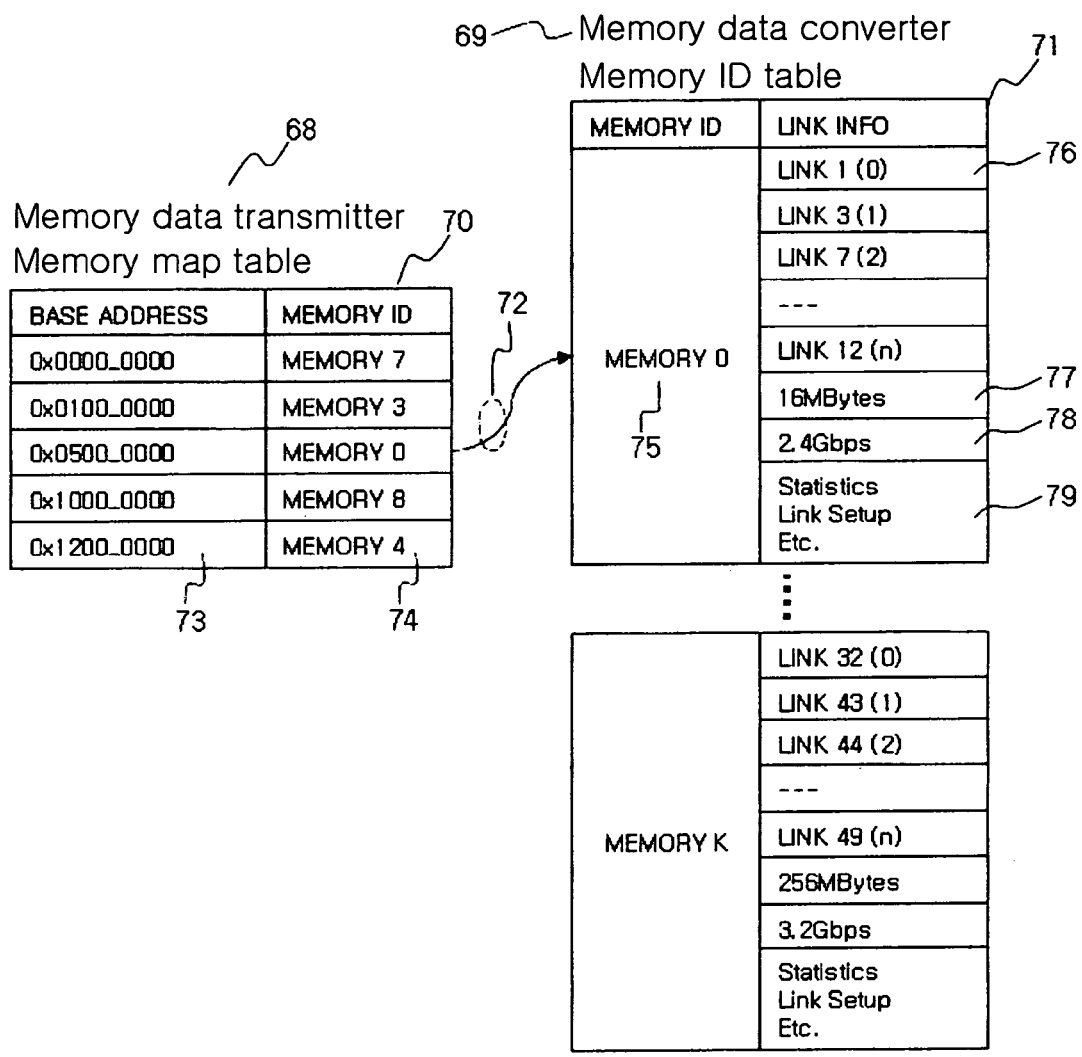
FIG. 5 is a block diagram for describing memory address conversion in the memory controller shown in FIG. 4.

FIG. 5 is a block diagram for describing memory address conversion in the memory controller shown in FIG. 4.

As shown in FIG. 5, when a memory accessing instruction and an address are received from the CPU 2, a memory data transmitter 68 finds the memory ID 74 of a memory address 73 to access from a memory map table 70. Then, the memory data transmitter 68 outputs the memory ID 74 through an internal bus 72 between the memory data transmitter 68 and a memory data converter 69.

The memory data converter 69 receives the memory ID 74 and searches serial port numbers of a memory ID 75 from a memory ID table 71. Herein, a serial port field 76 of a table includes physical port number information and virtual port number information.

When the serial ports 76 of a memory address 73 are found, the memory data converter 69 converts parallel memory data from the memory data transmitter 68 to serial memory data to be suitable to available serial ports. Then, the memory data converter 69 transmits the serial memory data to a corresponding memory.

When the memory data converter 69 receive serial memory data from a memory, the memory data converter 69 converts creates a parallel format memory data packet that includes memory address information, size information, error checking information and other information required for exchanging memory information and transmit the parallel format memory data packet to the memory data transmitter 68.

A memory ID table 71 in the memory data converter 69 includes size information 77 of a corresponding memory, link speed information 78 and statistical and link setting related information 79 as well as a memory ID 75 and related serial port information 76.

Figure 6:
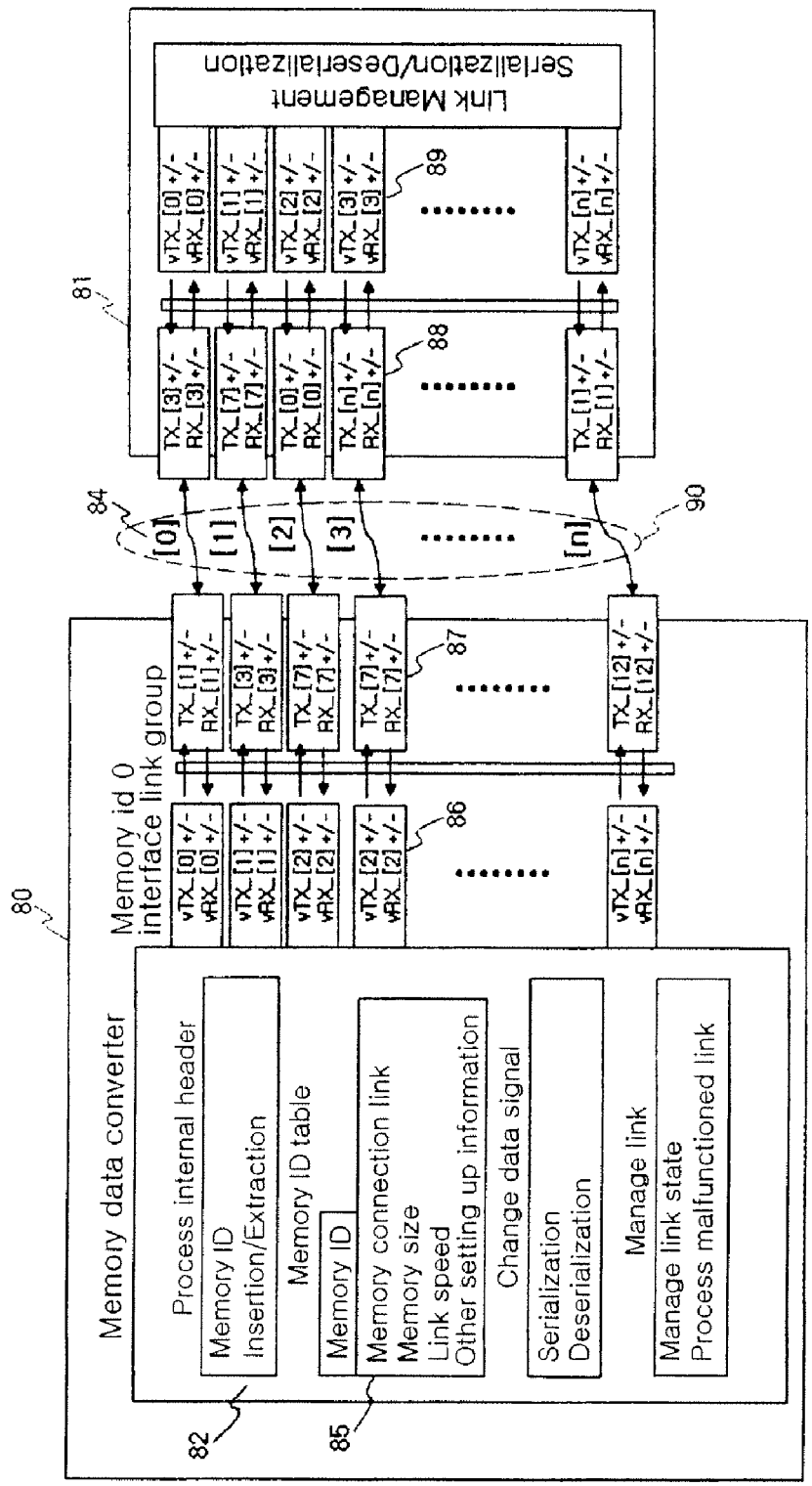
FIG. 6 is a view for describing virtual serial port number exchange between a memory controller and a memory according to an embodiment of the present invention.

FIG. 6 is a view for describing virtual serial port number exchange between a memory controller and a memory according to an embodiment of the present invention.

As shown in FIG. 6, a memory controller 80 transfers the numbers 84 of virtual ports 86 mapped to physical ports 87 of the memory controller 80 to a memory 81 through serial links 90. Herein, the memory 81 maps the virtual port numbers 84 received from the memory controller 80 through the physical ports 88 to virtual ports 89.

The physical port information and the virtual port information of the memory controller 80 are stored in a serial port information field of a memory ID table 85 in the memory data converter 82. The serial port information field is filled in a memory initial serial port setting up step.

Figure 7:
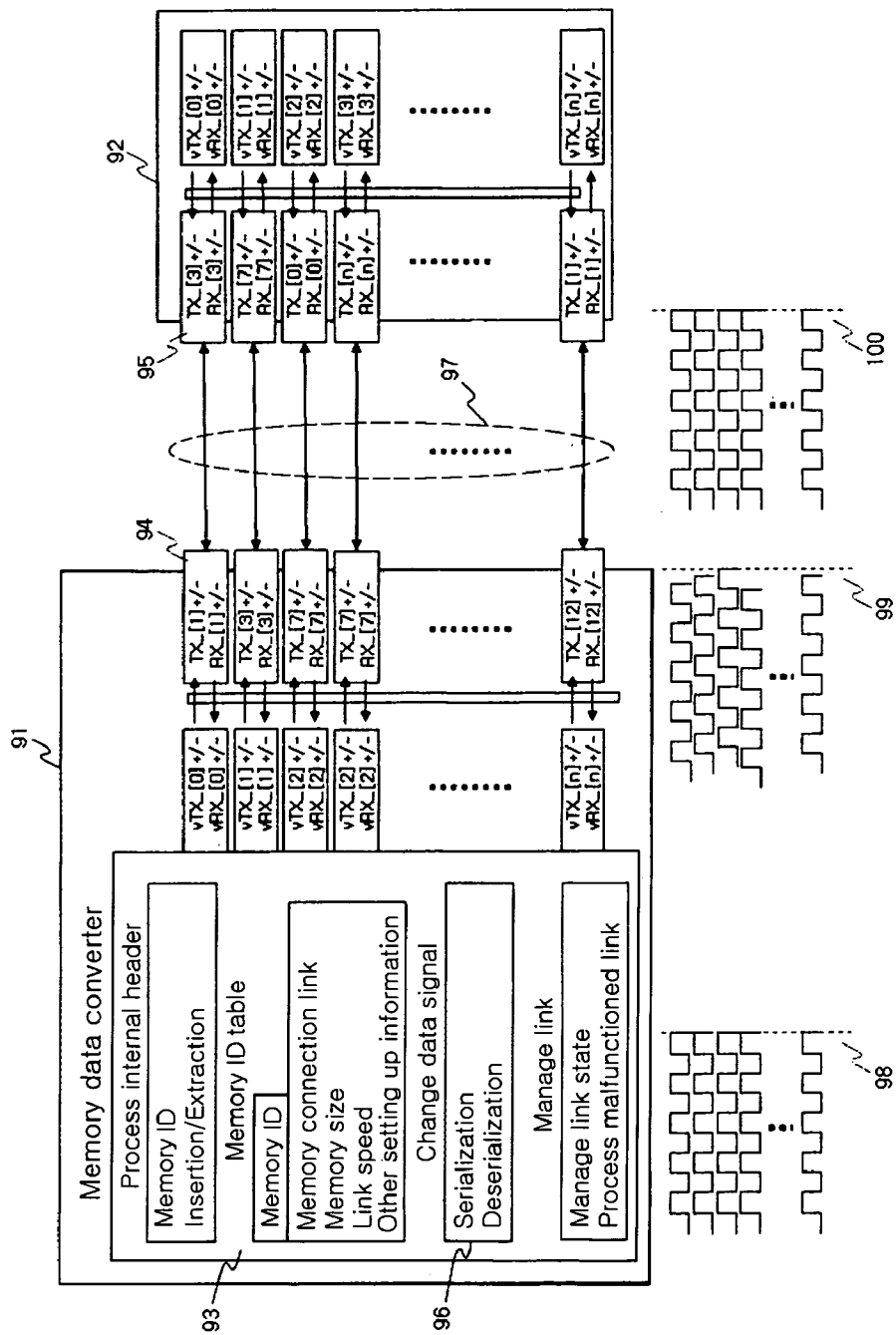
FIG. 7 is a view for describing transmission delay correction between a memory controller and a serial port according to an embodiment of the present invention.

FIG. 7 is a view for describing transmission delay correction between a memory controller and a serial port according to an embodiment of the present invention.

As shown in FIG. 7, in order to correct the transmitting delay which is generated by a wire length difference between the serial links 97 in serial data communication between the serial ports 94 of a memory controller 91 and the serial port 95 of a memory 92, a memory controller 91 creates internally synchronized serial data 98 by correcting a previously-learned transmission delay, which is previously learned at a data signal conversion block 96 of a memory data converter 93. Then, the internally synchronized serial data 98 is transmitted in a form of delay corrected serial data 99 at the serial ports 94.

The serial ports 95 of the memory 92 receive the delay corrected serial data 99 in a form of serial data 100 because the delay corrected serial data 99 is attenuated by the transmission delay while traveling through the serial link 97. The memory 92 transmits the synchronized serial data 100 through a serial link 97 when data is transmitted to a memory controller 91. The memory controller 91 receives the serial data 99 having the transmission delay generate by the wire length difference at the serial port 94. Then, the memory controller 91 creates serial data 98 by correcting the received serial data 99 in a data signal converter 96 of the memory data converter 93.

The learning of the transmission delay difference between serial links is performed in the memory initializing step. That is, the transmission delay difference between the serial links is calculated by exchanging a predetermined data pattern between the memory controller and the memory.

Figure 8:
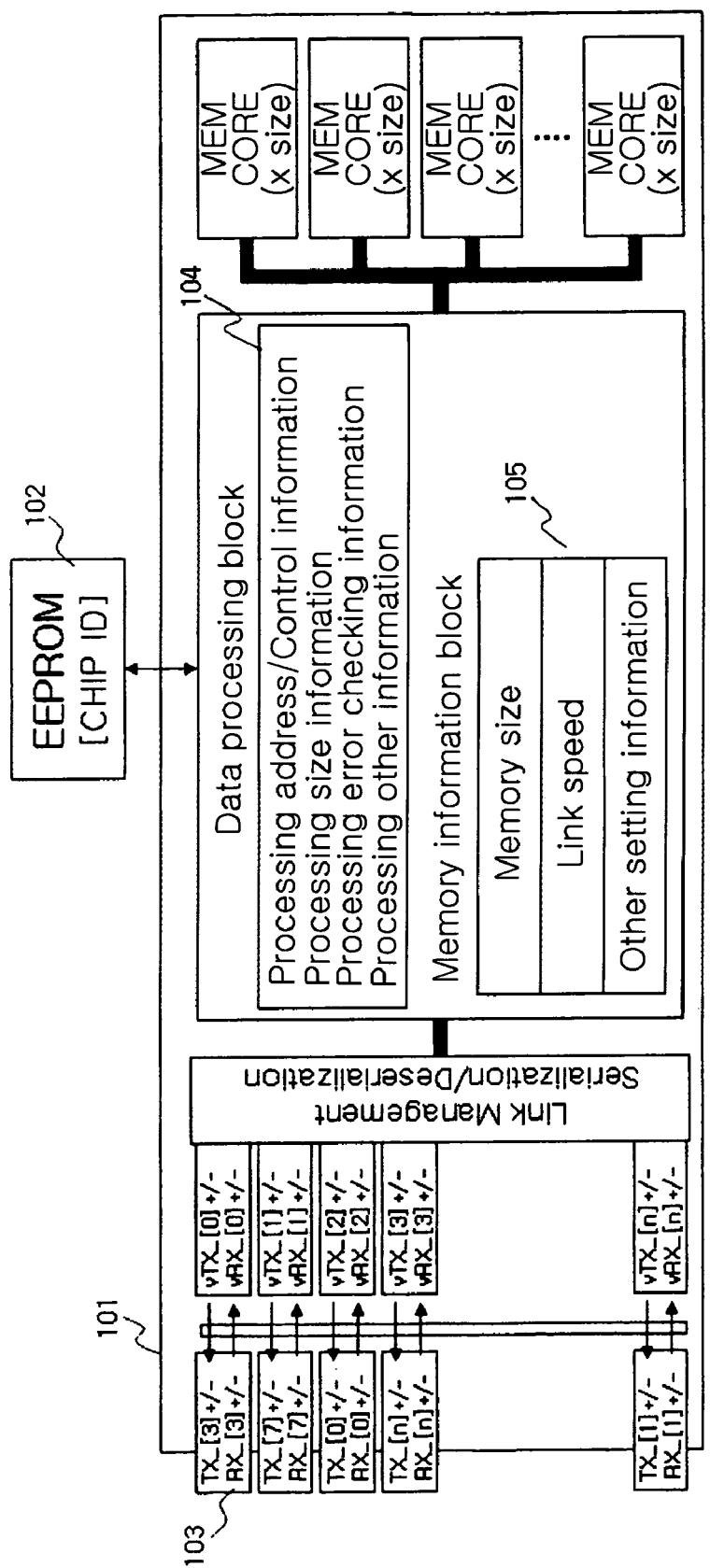
FIG. 8 is a view for describing storing an ID of memory in an external PROM according to an embodiment of the present invention.

FIG. 8 is a view for describing storing an ID of memory in an external PROM according to an embodiment of the present invention.

As shown in FIG. 8, the ID of a memory 101 is stored in an external programmable ROM (PROM) 102. Herein, a data processing block 104 read a memory ID from the PROM 102 at the moment electric power or a reset signal is applied to the memory 101. Then, the data processing block 104 stores the read memory ID in a memory information block 105.

Also, the data processing block 104 of the memory 101 outputs an ID value in a memory information block 105 when a memory ID value is requested from a memory controller through a serial port 103.

Figure 9:
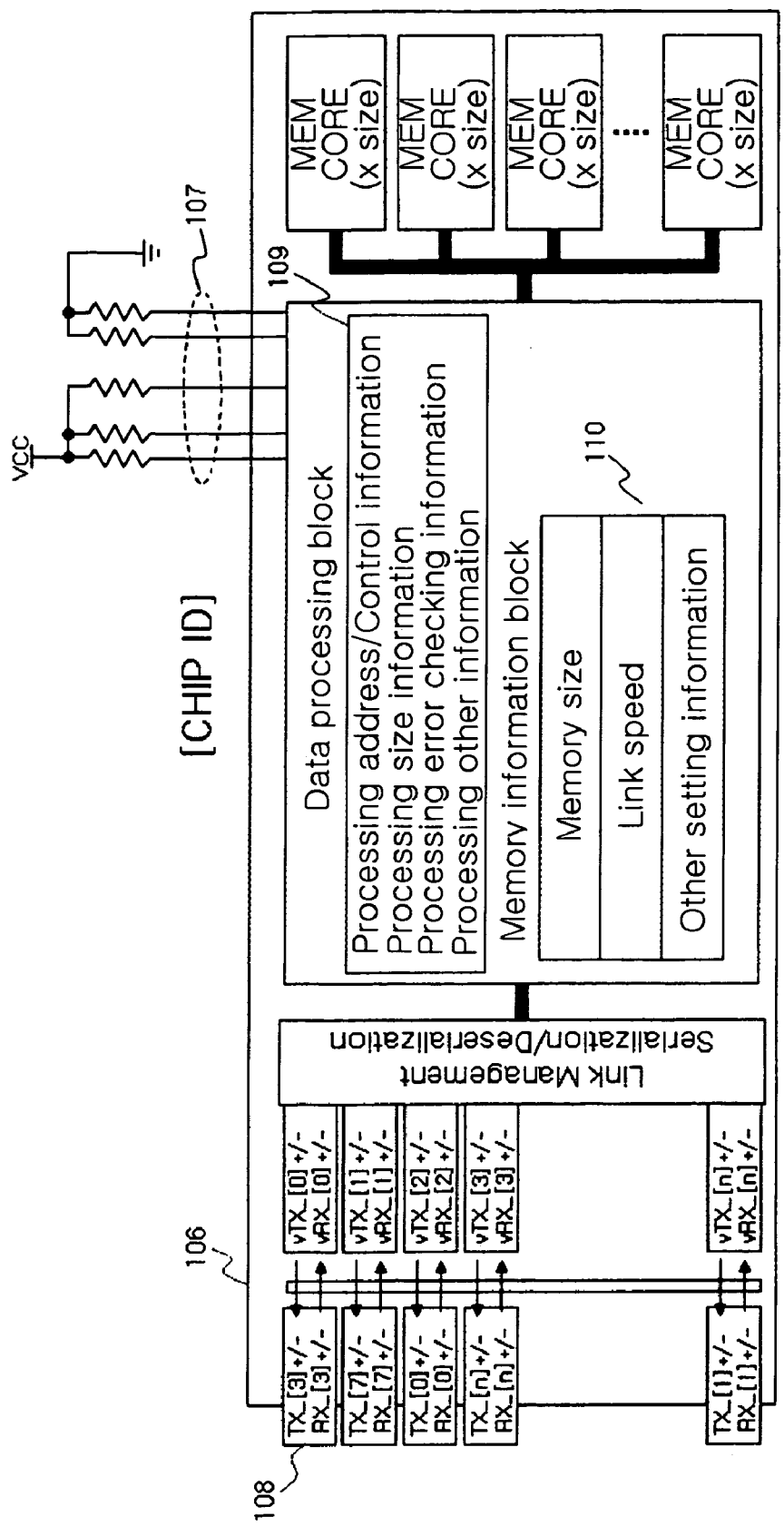
FIG. 9 is a view for describing setting up a memory ID through inputting pull-up/down signal according to an embodiment of the present invention.

FIG. 9 is a view for describing setting up a memory ID through inputting pull-up/down signal according to an embodiment of the present invention.

As shown in FIG. 9, the ID of a memory 106 has a value which is decided by pull up/down setting 107 of an external memory 106. Accordingly, a data processing block 104 reads a memory ID from the pull up/down setting 107 at the moment that electric power and a reset signal is applied. Then, the data processing block 104 stores the read memory ID at the memory information block 110.

Also, the data processing block 109 of the memory 106 outputs an ID value in a memory information block 101 to a corresponding serial port 108 when a memory ID value is required from a memory controller through a serial port 108.

Figure 10:
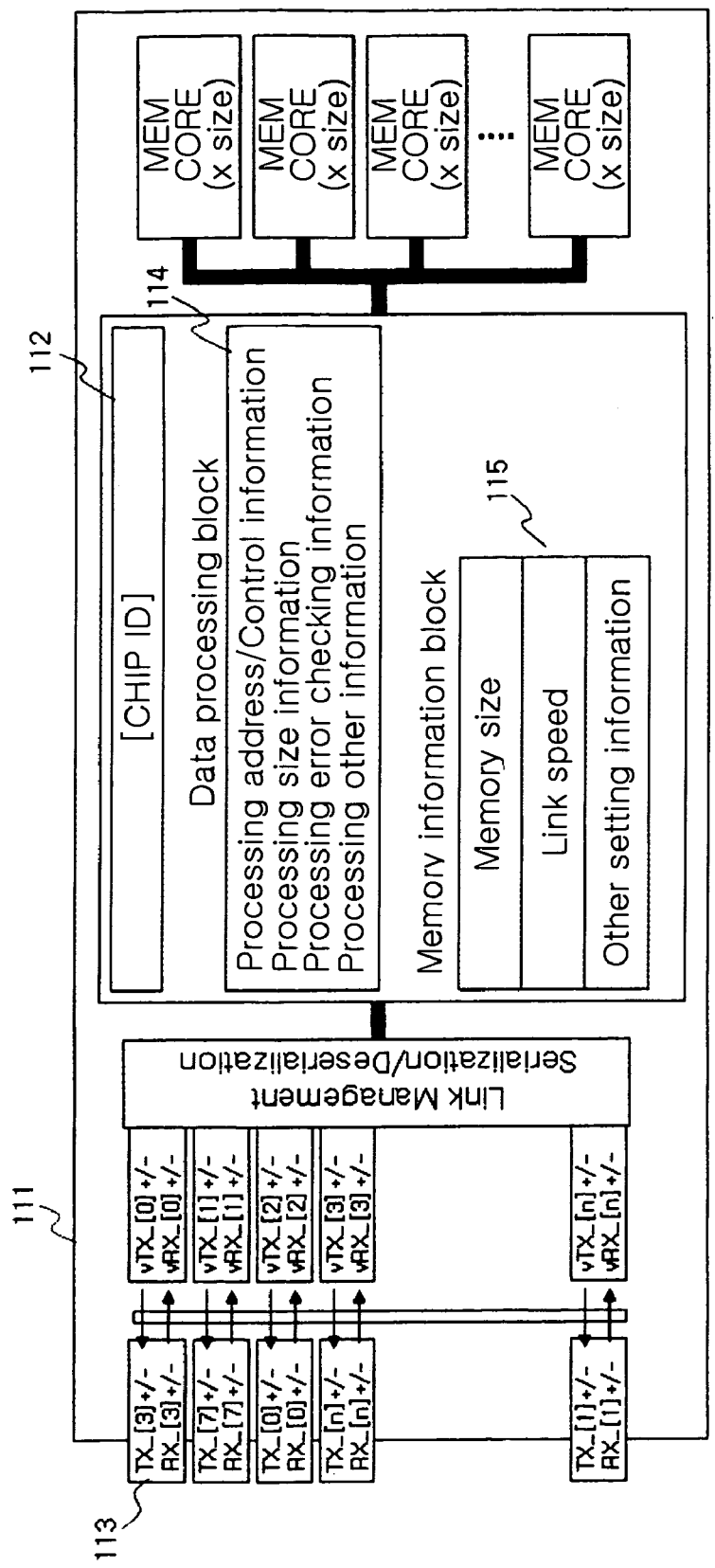
FIG. 10 is a view for describing storing an ID of a memory in a predetermined memory space according to an embodiment of the present invention.

FIG. 10 is a view for describing storing an ID of a memory in a predetermined memory space according to an embodiment of the present invention.

As shown in FIG. 10, the ID of a memory 111 is stored in a chip ID block 112 in the memory 111. Accordingly, a data processing block 114 reads a memory ID from a chip ID block 112 and stores the read memory ID at a memory information block 115 at the moment that electric power or a reset signal is applied to the memory 111.

Also, the data processing block 114 of the memory 111 outputs an ID value in the memory information block 115 to a corresponding serial port 113 when a memory controller requests a memory ID value through a serial port 113.

As described above, the memory system according to the present invention includes the memory controller and the memory connected each other through flexible serial links. The memory system according to the present invention allows the address of the memory to change by virtually setting the address of the memory. Also, the memory system according to the present invention has the enhanced capability for confronting the malfunctioning of the memory connection links and the memory itself. Thus, the time and cost for designing a memory system can be reduced. Furthermore, the memory system according to the present invention has enhanced reliability and availability. Moreover, it is easy to design and to embody the memory system according to the present invention to expand the memory capacity thereof.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A memory system with flexible serial interfaces comprising:
   at least one or more memories; and
   a memory controller for flexibly setting up serial link connections with each of the memories through serial ports regardless of a physical location and an order of the serial ports, said memory controller configured to assign virtual serial port numbers to the serial ports connected to each of the memories, while initializing the at least one or more memories, and said memories transmitting and receiving memory data in a serial mode through the serial link connection, wherein the memory controller changes the number of available serial links to a corresponding one of the memories if it is necessary.

2. The memory system of claim 1, wherein the memory controller changes address information corresponding to a memory ID regardless of physical serial link connection to the memory.

3. The memory system of claim 1, wherein the memory controller includes:
   an address decoder for decoding input address information of a memory device;
   a memory data transmitter for detecting a memory ID corresponding to the input address information, transmitting the detected memory ID, processing corresponding data, initializing and managing the memory;
   a memory data converter for internally exchanging information with the memory data transmitter, searching a serial port for the memory ID, converting serial memory data to parallel memory data, and managing the serial ports; and
   a plurality of serial ports for transmitting memory data to the memory through the serial links in a high speed serial mode.

4. The memory system of claim 3, wherein the memory data transmitter includes:
   a memory map table for managing memory addresses inputted from the address decoder and corresponding memory IDs;
   a data processing unit for managing information for processing memory data according to the memory data address information, control information, size information and error checking information as a parallel format memory data packet; and
   a memory initializing and managing unit for scanning the memory, managing the memory map table, and managing whether the memory is malfunctioned or not.

5. The memory system of claim 3, wherein the memory data converter includes:
   an internal header processing unit for exchanging internal information with the memory data transmitter;
   a memory ID table for managing and searching serial link ports corresponding to the memory IDs;
   a data signal converter for converting parallel memory data to serial memory data; and
   a link managing unit for checking states of serial ports, reporting malfunctioned links, and processing the malfunctioned links.

6. The memory system of claim 5, wherein the memory ID table includes a physical link number and a virtual link number corresponding to the memory ID.

7. The memory system of claim 6, wherein, while initializing the memory, the memory controller searches physical serial ports connected to the memory, arranges the searched serial ports with the memory as the reference, assigns virtual serial port numbers to the physical serial ports connected to the same memory sequentially from a lower number, and transmits the result thereof to serial ports of the memory through corresponding serial ports so as to enable the serial ports of the memory to have virtual serial port numbers identical to those of the memory controller.

8. The memory system of claim 1, wherein the memory controller transmits and receives serial link state information to/from the memories, stores malfunctioned link information, and establishes a memory interface only with available links without using a malfunctioned link in the memory initialization.

9. The memory system of claim 8, wherein the memory controller initializes the memory by at least one of electric power, a reset signal or a memory initialization instruction.

10. The memory system of claim 1, wherein the memory controller obtains a transmission delay difference among serial links connected to the same memory while initializing the memory and corrects the transmission delay difference for transmitting and receiving serial data to/from the memory.

11. The memory system of claim 1, wherein the memory controller sequentially transmits a memory ID request message to a memory through each serial pot for finding serial ports connected to a same memory, and the memory transmits an own memory ID to the memory controller as a response message.

12. The memory system of claim 11, wherein the memory controller stores the memory ID in the memory or in an external read-only memory, or using an externally inputted pull up/down signal.

13. The memory system of claim 1, wherein each of the memories includes:
a memory core including a memory logic;
a data processing unit for processing memory data; a memory storing unit for storing the memory data;
a link managing and converting unit for managing serial links connected to the memory controller and converting serial memory data to parallel memory data; and
a plurality of serial ports connected to the memory controller through the serial links for transmitting and receiving the memory data to/from the memory controller based on a serial mode.

14. A memory controller with flexible serial interfaces for initializing a memory and delivering memory data, the memory controller includes:
an address decoder for decoding input address information of a memory device;
a memory data transmitter for detecting a memory ID corresponding to the input address information, transmitting the detected memory ID, processing corresponding data, initializing and managing the memory;
a memory data converter for internally exchanging information with the memory data transmitter, searching a serial port for the memory ID, converting serial memory data to parallel memory data, and managing the serial ports; and
a plurality of serial ports for transmitting memory data to the memory through the serial links in a high speed serial mode, wherein the memory data is transmitted and received to/from the memory through the serial ports regardless of physical locations of the serial ports and a serial port order.

15. The memory controller of claim 14, wherein the memory data converter includes:
an internal header processing unit for exchanging internal information with the memory data transmitter; a memory ID table for managing and searching serial link ports corresponding to the memory IDs;
a data signal converter for converting parallel memory data to serial memory data; and
a link managing unit for checking states of serial ports, reporting malfunctioned links, and processing the malfunctioned links.

16. A method for accessing a memory from a memory controller with flexible serial interface, the method comprising the steps of:
a) initializing links to access memories by searching the memories to access at a memory controller;
b) when a memory reading instruction is inputted, receiving a parallel memory address and a control instruction, searching a corresponding memory ID based on the received parallel memory address and control instruction, finding a connection link from the memory ID, converting the parallel memory address and control instruction to serial data, and transmitting the serial data with an instruction request number to a corresponding memory through the connection link;
c) at the memory, receiving a reading instruction and an address, and transmitting corresponding data through a connection link with an instruction request number at a memory core;
d) checking the instruction request number from data inputted through the serial port, converting serial data to parallel data, and transferring the reading instruction corresponding to the instruction request number;
e) when a reading instruction transmitting side writes the memory, finding a corresponding serial link from parallel data and an address, and transmitting the found serial link with an instruction request number to the memory; and
f) writing the data at a memory core by receiving a writing instruction at the memory.

17. The method of claim 16, wherein the b) step includes the steps of:
transmitting a memory ID, a size information and speed information request message to a memory and receiving a response from the memory;
inputting link information by the memory IDs to a memory ID table;
inputting address locations by the memory IDs to a memory map table;
synchronizing links connected to a same memory; and
exchanging virtual link numbers of links connected to the same memory.

* * * * *